US012578147B2

(12) United States Patent
Chen et al.

(10) Patent No.: US 12,578,147 B2
(45) Date of Patent: Mar. 17, 2026

(54) VARIED FLOW STACKED RADIATORS

(71) Applicant: Quanta Computer Inc., Taoyuan City
(TW)

(72) Inventors: Chao-Jung Chen, Taoyuan City (TW);
Yu-Nien Huang, Taoyuan City (TW);
Herman Tan, Taoyuan City (TW)

(73) Assignee: Quanta Computer Inc., Taoyuan City
(TW)

( * ) Notice: Subject to any disclaimer, the term of this
patent is extended or adjusted under 35
U.S.C. 154(b) by 117 days.

(21) Appl. No.: 18/417,307

(22) Filed: Jan. 19, 2024

(65) Prior Publication Data

US 2025/0123056 A1 Apr. 17, 2025

Related U.S. Application Data

(60) Provisional application No. 63/589,851, filed on Oct.
12, 2023.

(51) Int. Cl.
*H05K 7/20* (2006.01)
*F28D 1/053* (2006.01)
*F28F 1/12* (2006.01)

(52) U.S. Cl.
CPC .......... *F28D 1/05383* (2013.01); *F28F 1/126*
(2013.01); *H05K 7/20736* (2013.01); *F28F*
*2215/04* (2013.01)

(58) Field of Classification Search
CPC ....... F28D 1/05383; F28F 1/126; F28F 1/128;
H05K 7/20736
See application file for complete search history.

(56) References Cited

U.S. PATENT DOCUMENTS 4,300,629 A 11/1981 Hatada et al.
6,775,137 B2 * 8/2004 Chu ................... H05K 7/20754
361/679.54

FOREIGN PATENT DOCUMENTS

| CN | 112368536 A | 2/2021 | |
|---|---|---|---|
| CN | 115854599 A | 3/2023 | |
| EP | 2196758 A1 * | 6/2010 | ............. F28F 1/126 |
| JP | 2004316937 A * | 11/2004 | ......... F28D 1/05383 |

OTHER PUBLICATIONS

TW Office Action for Application No. 113113716 mailed Dec. 23,
2024, w/ First Office Action Summary, 7 pp.
TW Search Report for Application No. 113113716 mailed Dec. 23,
2024, w/ First Office Action, 1 p.

* cited by examiner

*Primary Examiner* — Eric S Ruppert
(74) *Attorney, Agent, or Firm* — NIXON PEABODY LLP

(57) ABSTRACT

A radiator apparatus and a radiator assembly include a
plurality of radiators stacked together such that a fluid
passing through the radiator apparatus passes through each
radiator of the plurality of radiators. Each radiator has fins
spanning across a thickness of the radiator. The fins define
channels for the fluid to flow through the radiator. The
channels have respective orientations in the plurality of
radiators. The orientations of the channels in adjacent radia-
tors differ such that a direction of the fluid passing through
the plurality of radiators changes between adjacent radiators.

14 Claims, 7 Drawing Sheets

VARIED FLOW STACKED RADIATORS

CROSS-REFERENCE TO RELATED APPLICATIONS

The present application claims the benefit of and priority to U.S. Provisional Application No. 63/589,851, filed Oct. 12, 2023, and entitled, "Active Regenerate Boundary Layer With Dynamic Flow Stacked Radiator," the content of which is hereby incorporated by reference herein in its entirety.

FIELD OF THE INVENTION

The present invention relates generally to radiators, and more specifically, to reducing the pressure drop of the convective fluid flowing through a radiator.

BACKGROUND OF THE INVENTION

Cooling is an important part of computing systems because of the need to remove potentially large quantities of heat generated from computing operations. Essential components of cooling systems are radiators and radiator assemblies. FIG. 1 shows a conventional radiator assembly 100. The radiator assembly 100 dictates the overall cooling capabilities of a cooling system. Heat from, for example, a computing system is transferred to the radiator assembly 100 with fluid as a medium. The heat from the fluid is then dissipated through the surface area of the radiator assembly 100 by another fluid, such as forced air, which is often referred to as forced convection or the convective fluid.

The radiator assembly 100 includes a radiator 102 and two side tanks 104. The two side tanks 104 are configured to collect and distribute a fluid that is to be cooled or warmed by the radiator assembly 100. The radiator 102 includes fins 106 that define channels 108 that allow a fluid (represented by the arrow 110), such as air, to pass through the radiator 102. Although not shown, another fluid flows between the side tanks 104 and across the radiator 102 to (typically) be cooled by the fluid 110 that passes through the radiator 102. However, in some situations, the fluid flowing between the side tanks 104 and across the radiator 102 may be warmed by the fluid 110 that passes through the radiator 102.

In some situations, the surface area of a radiator assembly is designed with as large of a heat transfer area as possible. Thus, in some situations, radiators of the same size are stacked together to multiply the heat transfer area. Accordingly, the radiator 102 within the radiator assembly 100 of FIG. 1 may instead be a radiator apparatus 200, as partially shown in FIG. 2.

The radiator apparatus 200 includes three radiators 202a, 202b, and 202c (each designated by the dashed lines) stacked together. Like in FIG. 1, each of the three radiators 202a, 202b, and 202c include fins 204 that define channels 206 that allow a fluid (represented by the arrow 208) to pass through the radiator apparatus 200, including all the three radiators 202a, 202b, and 202c.

FIG. 3 is a partial detailed view of a radiator 300, such as the radiator 102 of FIG. 1 or one of the three radiators 202a, 202b, and 202c of FIG. 2. The radiator 300 includes two generally parallel plates 302. Fins 304 span between plates 302. According to some aspects, and as illustrated in FIG. 3, the fins 304 can be formed of single sheet of material, such as metal, that is compressed to form repeating S-shapes. Alternatively, the fins 304 can be formed from separate pieces of material, such as metal. The fins 304 form channels 306 through which a fluid passes, such as the convective fluid 110 of FIG. 1 or the convective fluid 208 of FIG. 2.

The arrow 308 represents generally the orientation of the length of the radiator 300. The arrow 310 represents generally the orientation of the fins 304 and channels 306 relative to the length 308 of the radiator 300. When radiators are stacked together, such as the radiators 202a, 202b, and 202c of the radiator apparatus 200 of FIG. 2, the radiators all have fins with the same orientation (e.g., orientation 310). The same orientation of the fins increases the pressure drop across the radiator assembly. The increased pressure drop lowers the force convection of fluid through the radiator assembly, which can cause airflow to bypass the radiator assembly and degrade the overall cooling performance.

The present disclosure provides radiators, apparatuses, and assemblies that solve the above-described issues.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a radiator apparatus is disclosed. The radiator apparatus includes a plurality of radiators stacked together such that a fluid passing through the radiator apparatus can passes through each radiator of the plurality of radiators. Each radiator has fins spanning across a thickness of the radiator. The fins define channels for the fluid to flow through the radiator. The channels have respective orientations in the plurality of radiators. The orientations of the channels in adjacent radiators differ such that a direction of the fluid passing through the plurality of radiators changes between adjacent radiators.

According to further aspects, the orientations of the channels cause the fluid to pass through the radiator apparatus in the shape of an S. According to further aspects, the radiator apparatus includes gaps between adjacent radiators through which the fluid can flow when passing between adjacent radiators. According to further aspects, all orientations of the channels within a radiator of the plurality of radiators is the same. According to further aspects, all the orientations of the channels within two non-adjacent radiators of the plurality of radiators are the same. According to further aspects, the plurality of radiators includes four radiators. According to further aspects, none of the orientations of the channels is the same. According to further aspects, a computing system is disclosed that includes an above-described radiator apparatus. According to further aspects, a computing system is disclosed that includes a plurality of radiator apparatuses, each of the plurality of radiator apparatuses being the above-described radiator apparatus. Each radiator apparatus can be oriented to be non-parallel with the fluid passing through the computing system.

According to certain additional aspects of the present disclosure, a radiator assembly is disclosed. The radiator assembly includes a pair of tanks configured to distribute and collect a fluid to/from a radiator stack. The radiator assembly further includes a radiator apparatus. The radiator apparatus includes a plurality of radiators stacked together to form the radiator stack. The plurality of radiators is configured such that a fluid passing through the radiator apparatus passes through each radiator of the plurality of radiators. Each radiator includes fins spanning across a thickness of the radiator. The fins define channels for the fluid to flow through the radiator. The orientations of the channels of adjacent radiators differ such that a direction of the fluid passing through the plurality of radiators changes between the adjacent radiators.

According to further aspects, the orientations of the channels cause the fluid to pass through the radiator apparatus in the shape of an S. According to further aspects, the radiator apparatus further includes gaps between the adjacent radiators through which the fluid can flow when passing between the adjacent radiators. According to further aspects, the orientation of the channels within a radiator of the plurality of radiators is the same. According to further aspects, the orientations of the channels within two non-adjacent radiators of the plurality of radiators are the same. According to further aspects, the plurality of radiators includes four radiators. According to further aspects, none of the orientations of the channels is the same.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
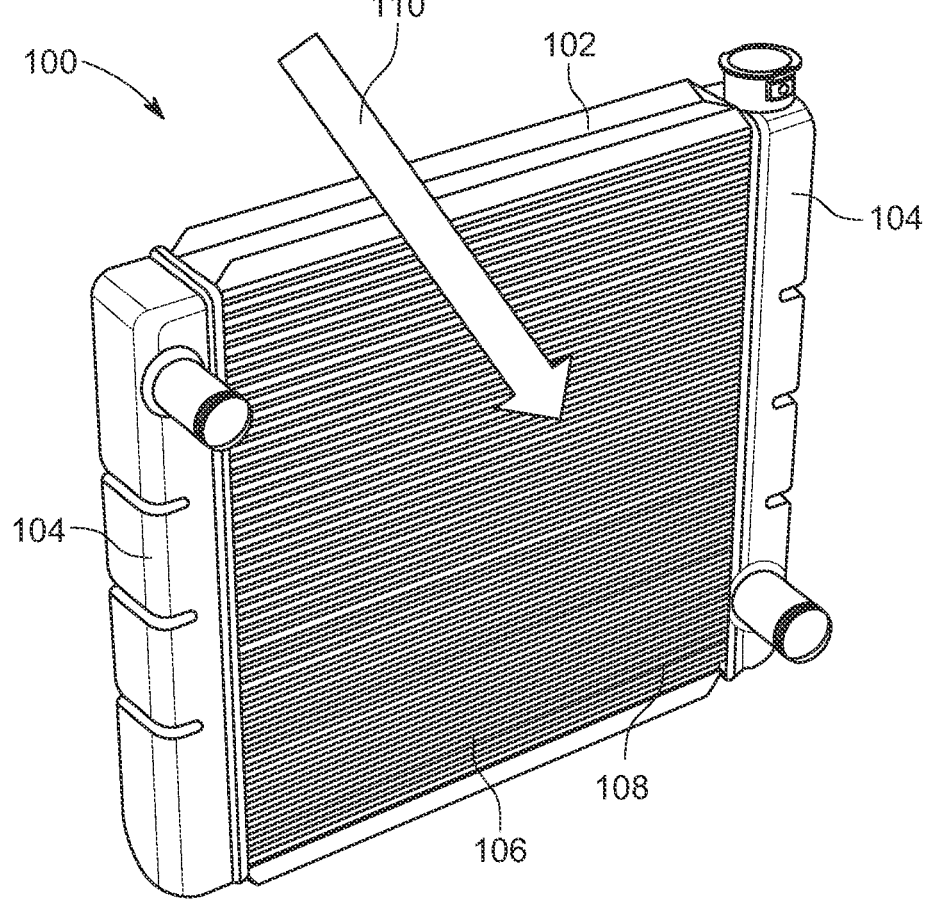
FIG. 1 is a perspective view of a radiator assembly.
Figure 2:
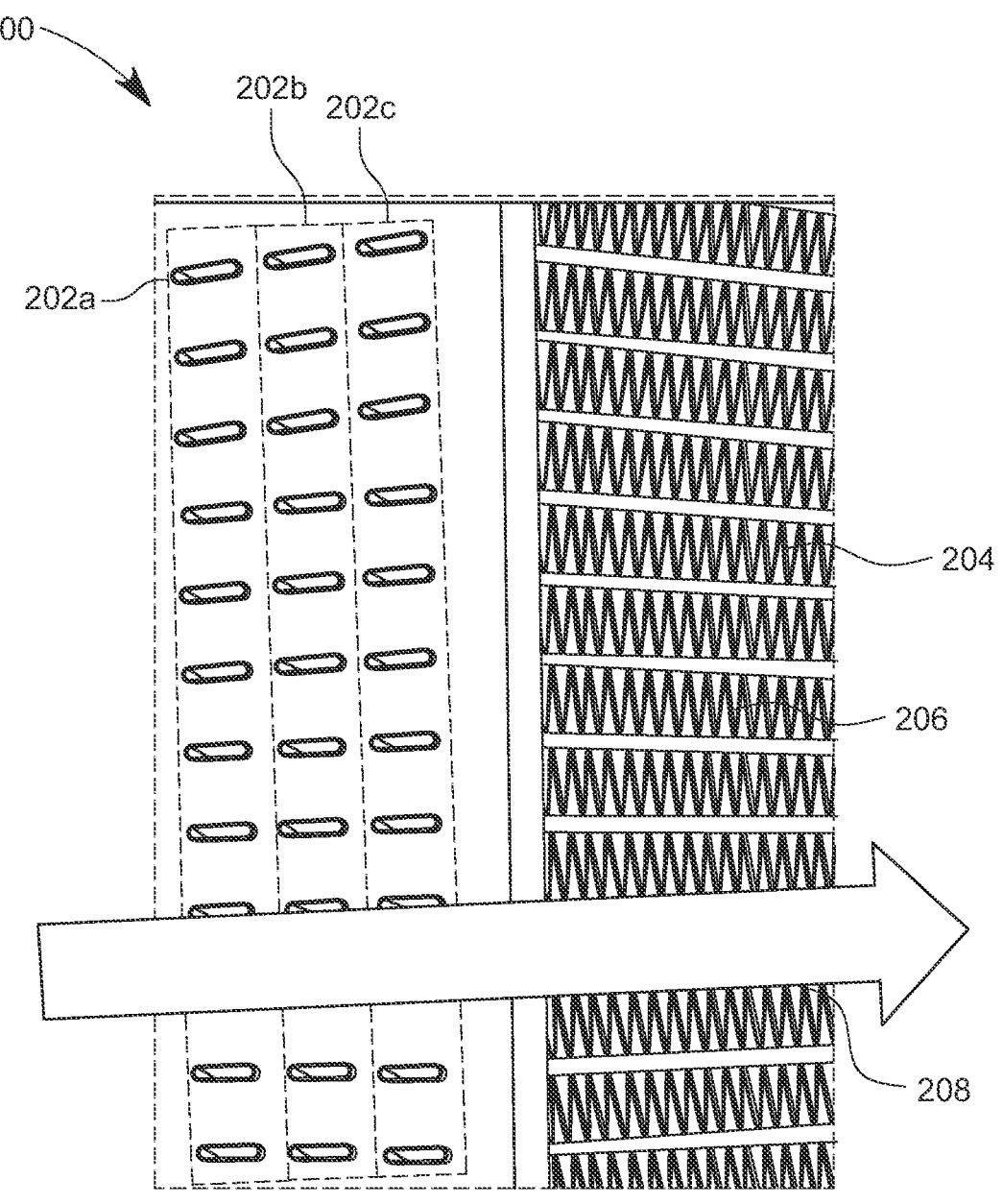
FIG. 2 is a partial perspective view of stacked radiators within a radiator assembly.
Figure 3:
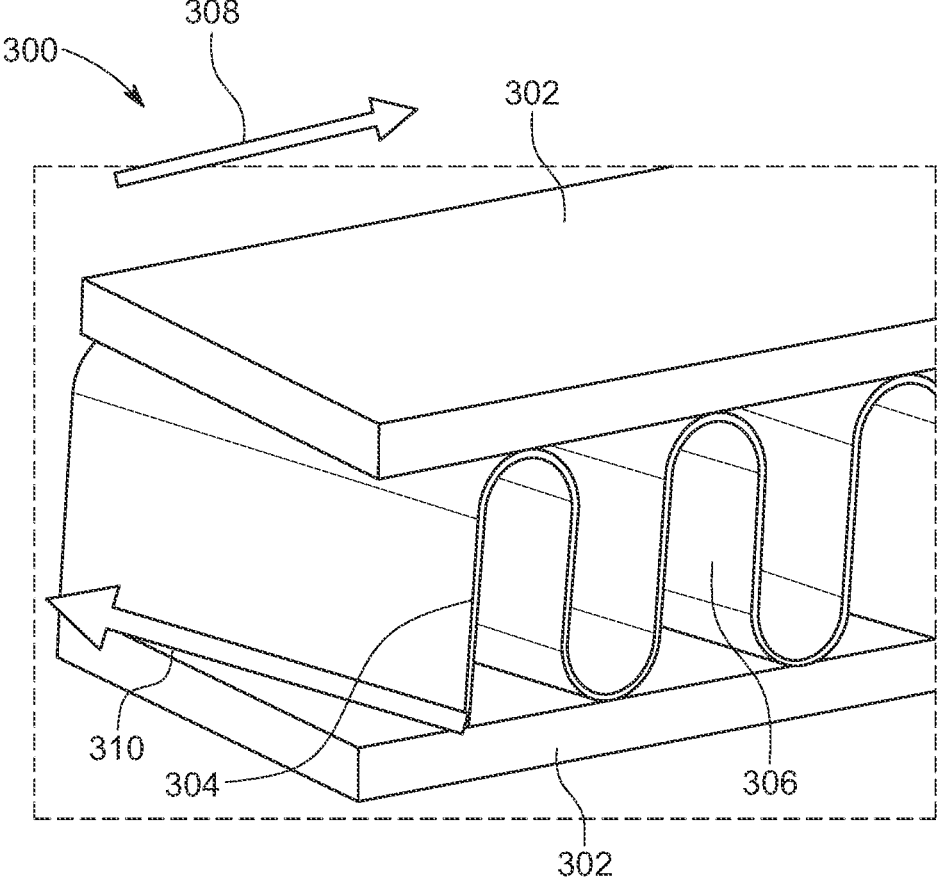
FIG. 3 is a partial cross-sectional view of fins and channels within a radiator.
Figure 4:
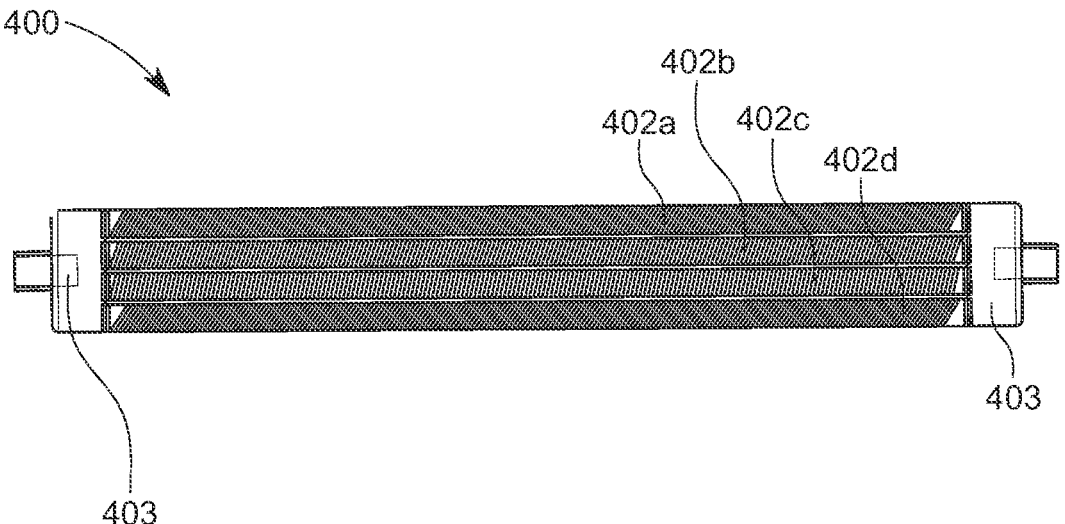
FIG. 4 is a cross-sectional view of a radiator assembly, according to aspects of the present disclosure.

FIG. 4 shows a cross-sectional view of a radiator assembly 400, according to aspects of the present disclosure. The radiator assembly 400 includes four radiators 402a-d, forming a radiator stack or radiator apparatus. However, the radiator assembly 400 can include any number of stacked radiators, such as two, three, five, six, etc. The radiator assembly 400 further includes tanks 403 on opposite sides of the four radiators 402a-d. The tanks 403 are to distribute and collect a fluid to/from the four radiators 402a-d. Unlike the conventional radiator assembly 100 of FIG. 1, the fins of each radiator 402a-d have different orientations relative to the fins of the other radiators 402a-d.

Figure 5:
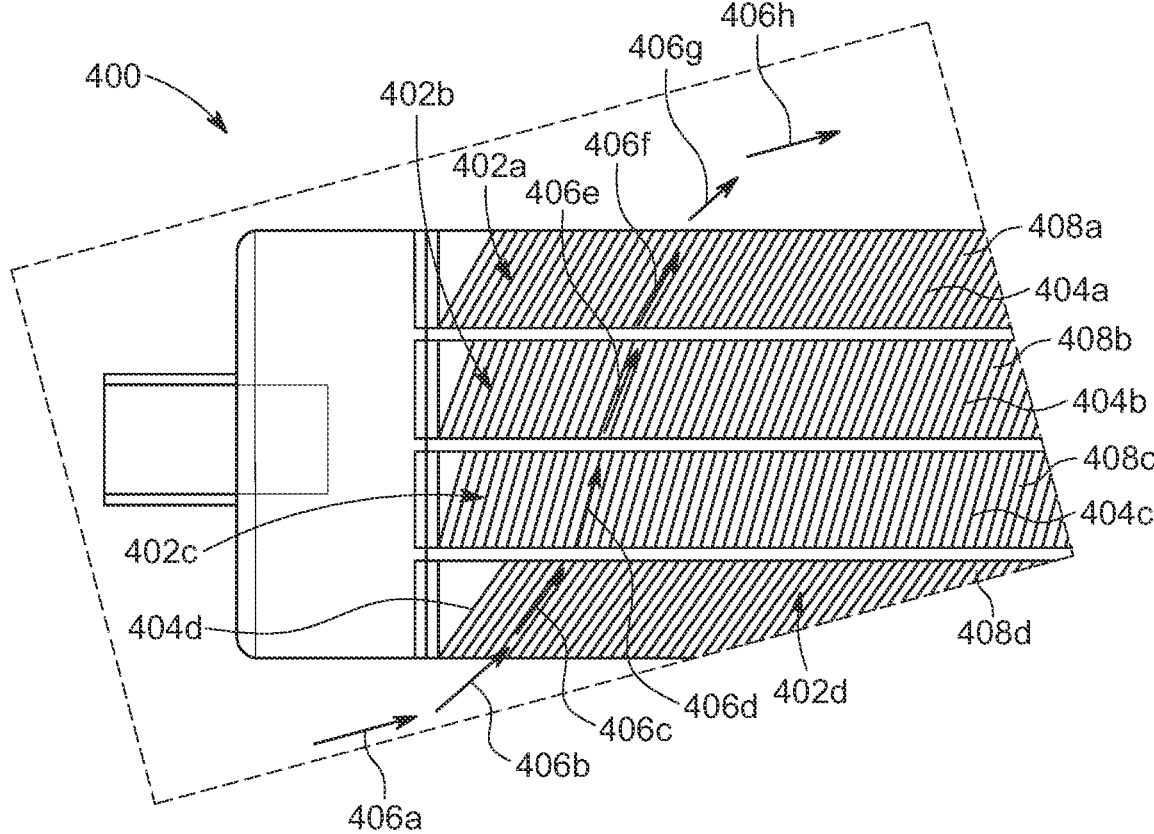
FIG. 5 is a detailed partial cross-sectional view of the radiator assembly of FIG. 4, according to aspects of the present disclosure.

For example, and referring to FIG. 5, shown is a detailed view of the radiator assembly 400 of FIG. 4, according to aspects of the present disclosure. As shown, fins 404a-d for the radiators 402a-d, respectively, each have different orientations relative to the other of the fins 404a-d. Specifically, the arrows 406a-h illustrate the directions of airflow through the radiator assembly 400. Moreover, with respect to each one of the radiators 402a-d, the arrows 406c-f illustrate the orientations of channels 408a-d formed by the fins 404a-d of the radiators 402a-d. In other words, the airflow through the radiators 402a-d is through the channels 408a-d. As shown, the orientations of the channels 408a-d for the radiators 402a-d vary. For example, the orientations of the channels 408a-d cause the fluid to pass through the radiator assembly 400 in the shape of an S.

According to some aspects, and as shown in FIG. 5, none of the orientations of the channels 408a-d are the same. Alternatively, as discussed above, orientations of the channels of adjacent radiators (e.g., radiators 402a and 402b) may differ. Thus, as shown by arrows 406e and 406f, the orientations of the arrows differ such that the direction of the airflow passing through the plurality of radiators changes between radiators 402a and 402b. However, the orientations of channels (e.g., radiators 406f and 406d) for two non-adjacent radiators (e.g., radiators 406a and 406c) can be the same (not shown). The difference between the adjacent channels 408a-d of the radiators 402a-d alleviates the pressure drop through the radiator assembly 400. According to some aspects, the widths and/or pitches of the channels 408a-d and/or the fins 404a-d can vary. Different channel and fin pitch or width size can control the overall pressure drop, which can increase heat transfer efficiency.

According to some aspects, the fins of a single radiator, and therefore the channels of the radiator, may have the same orientation, such as shown for the radiators 402a-d of FIG. 5. However, according to some alternative aspects, the fins of a single radiator, and therefore the channels of the radiator, may have varying orientations. According to these aspects, the adjacent fins of adjacent radiators stacked within a radiator assembly can still have different orientations such that the airflow through adjacent channels still varies through the local areas of the radiator assembly.

Figure 6:
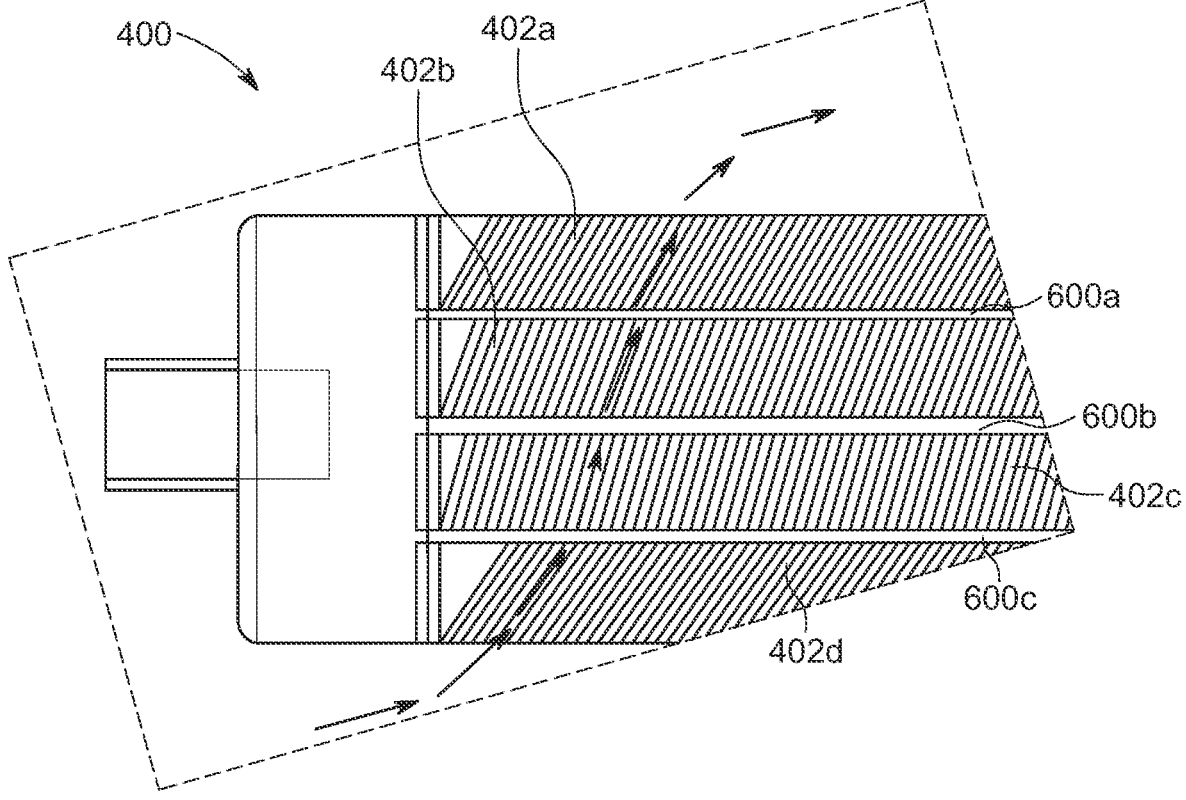
FIG. 6 is another detailed partial cross-sectional view of the radiator assembly of FIG. 4, according to aspects of the present disclosure.

Referring to FIG. 6, the radiator assembly 400 can include gaps 600a-c between adjacent radiators 402a-d. The gaps 600a-c can help increase cooling performance by allowing a boundary layer on the fins 404a-d to re-develop.

Figure 7:
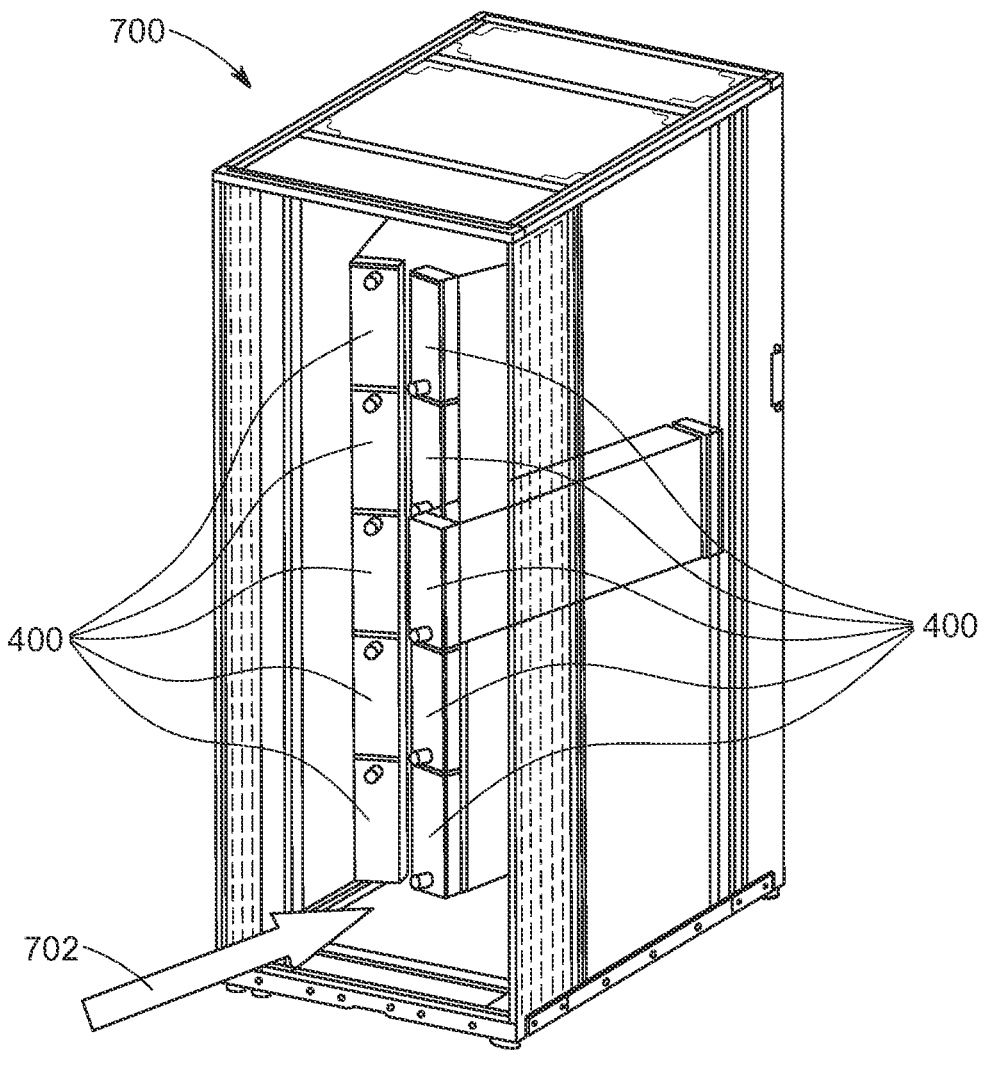
FIG. 7 is a perspective view of a computing system containing radiator assemblies of the present disclosure, according to aspects of the present disclosure.

Referring to FIG. 7, a computing system 700 is shown, according to aspects of the present disclosure. The computing system 700 includes multiple of the radiator assembly 400 (radiator assemblies 400). The radiator assemblies 400 can be oriented relative to airflow through the computing system 700, as represented by the arrow 702, such that some of the airflow 702 passes through the radiator assemblies 400. For example, the radiator assemblies 400 can be slightly off parallel from the airflow orientation into the computing system 700, as represented by the arrow 702. Because of the orientations of the fins and channels of the radiator assemblies 400 described above, the pressure drop of the airflow 702 through the computing system 700 is less than with conventional radiator assemblies.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
a computing housing; and
multiple radiator assemblies that include a first radiator assembly and a second radiator assembly, each of the multiple radiator assemblies including:
a plurality of radiators stacked together such that a fluid passing through the radiator apparatus passes through each radiator of the plurality of radiators, the fluid flowing initially in an inlet direction before it reaches the multiple radiator assemblies, each radiator having fins spanning across a thickness of the radiator, the fins defining channels for the fluid to flow through the radiator, the fins having respective orientations in the plurality of radiators; and
wherein the orientations of the channels in adjacent radiators differ such that a subsequent direction of the fluid passing through the plurality of radiators changes between adjacent radiators and
wherein the first radiator assembly is oriented in a first non-parallel direction relative to the inlet direction of the fluid, the second radiator assembly being oriented in a second non-parallel direction relative to the inlet direction of the fluid, the first radiator assembly and the second radiator assembly being mounted in the computing housing generally parallel to each other along a height of the computing housing.

2. The computing system of claim 1, wherein the orientations of the channels cause the fluid to pass through the radiator apparatus in the shape of an S.

3. The computing system of claim 1, further comprising gaps between adjacent radiators through which the fluid can flow when passing between adjacent radiators.

4. The computing system of claim 1, wherein all the orientations of the channels within a radiator of the plurality of radiators is the same.

5. The computing system of claim 1, wherein all the orientations of the channels within two non-adjacent radiators of the plurality of radiators are the same.

6. The computing system of claim 1, wherein the plurality of radiators includes four radiators.

7. The computing system of claim 1, wherein none of the orientations of the channels is the same.

8. A computing system comprising:
a computing housing; and
a plurality of radiator assemblies that include a first radiator assembly and a second radiator assembly, each of the multiple radiator assemblies including:
a pair of tanks configured to distribute and collect a fluid to/from a radiator stack; and
a radiator apparatus including:
a plurality of radiators stacked together to form the radiator stack, the plurality of radiators being configured such that a fluid passing through the radiator apparatus passes through each radiator of the plurality of radiators, the fluid flowing initially within the radiator assembly in an inlet direction before it reaches the radiator apparatus, each radiator having fins spanning across a thickness of the radiator, the fins defining channels for the fluid to flow through the radiator,
wherein orientations of the channels of adjacent radiators differ such that a subsequent direction of the fluid passing through the plurality of radiators changes between the adjacent radiators,
wherein each radiator of the plurality of radiators is oriented along its length in a non-parallel orientation relative to the inlet direction of the fluid; and
wherein the first radiator assembly is oriented in a first non-parallel direction relative to the inlet direction of the fluid, the second radiator assembly being oriented in a second non-parallel direction relative to the inlet direction of the fluid, the first radiator assembly and the second radiator assembly being mounted in the computing housing generally parallel to each other along a height of the computing housing.

9. The computing system of claim 8, wherein the orientations of the channels cause the fluid to pass through the radiator apparatus in the shape of an S.

10. The computing system of claim 8, further comprising gaps between the adjacent radiators through which the fluid can flow when passing between the adjacent radiators.

11. The computing system of claim 8, wherein the orientation of the channels within a radiator of the plurality of radiators is the same.

12. The computing system of claim 8, wherein the orientations of the channels within two non-adjacent radiators of the plurality of radiators are the same.

13. The computing system of claim 8, wherein the plurality of radiators includes four radiators.

14. The computing system of claim 8, wherein none of the orientations of the channels is the same.

* * * * *